US006954538B2

(12) United States Patent
Shiraishi

(10) Patent No.: US 6,954,538 B2
(45) Date of Patent: Oct. 11, 2005

(54) REMOTE CONTROL APPARATUS AND A RECEIVER AND AN AUDIO SYSTEM

(75) Inventor: Tadashi Shiraishi, Kanagawa-Ken (JP)

(73) Assignee: Koninklijke Philips Electronics N.V., Eindhoven (NL)

( * ) Notice: Subject to any disclaimer, the term of this patent is extended or adjusted under 35 U.S.C. 154(b) by 675 days.

(21) Appl. No.: 09/873,563

(22) Filed: Jun. 4, 2001

(65) Prior Publication Data

US 2003/0043051 A1 Mar. 6, 2003

(30) Foreign Application Priority Data

Jun. 8, 2000 (JP) ....................................... 2000-172787

(51) Int. Cl.[7] ................................................ H03G 3/00

(52) U.S. Cl. ......................... 381/105; 381/107; 381/26; 381/56; 381/58

(58) Field of Search ............................. 381/26, 92, 56, 381/58, 105, 107; 348/14.02, 14.05, 734; 340/825.24, 825.25

(56) References Cited

U.S. PATENT DOCUMENTS 5,386,478 A 1/1995 Plunkett ..................... 381/103
6,069,567 A * 5/2000 Zawilski ................ 340/825.22
6,696,972 B1 * 2/2004 Bryans .................. 340/825.72

OTHER PUBLICATIONS

Patent Abstract of Japan, vol. 2000, No. 3, Mar. 30, 2000 JP 11355899.

* cited by examiner

*Primary Examiner*—Xu Mei
*Assistant Examiner*—Corey Chan
(74) *Attorney, Agent, or Firm*—Edward W. Goodman

(57) ABSTRACT

In regard to an audio system using a plurality of speakers, various settings, adjustment and compensation of a receiver are enabled. A remote control apparatus which can operate and adjust a multi-channel receiver includes a transmitter for transmitting data to the receiver; a microphone for receiving sound outputted from the receiver; and an arithmetic operating unit which calculates the state of the receiver from the sound received by the microphone and analyzes an adjustment value of the receiver from a calculation result, wherein the transmitter transmits data for initiating adjustment for the receiver and transmits an analysis result obtained by the arithmetic operating unit to the receiver.

8 Claims, 7 Drawing Sheets

REMOTE CONTROL APPARATUS AND A RECEIVER AND AN AUDIO SYSTEM

BACKGROUND OF THE INVENTION

1. Field of the Invention

The invention relates to a remote control apparatus, a receiver and an audio system and, in particular, to a remote control apparatus that is capable of operating and adjusting a multi-channel receiver, and to a receiver that is capable of outputting multi-channel sounds, as well as an audio system that comprises the receiver and the remote control apparatus.

2. Description of the Related Art

In setting up an amplifier or a receiver used in an audio-visual (AV) system, such an AV system typically uses five speakers, which are to be placed at the front right, front center, front left, rear right and rear left sides, respectively, as well as a subwoofer for enhancing the bass sound. After the setup, the following adjustments may be required:

(1) Configuration of Speakers

In such systems, the following setups are required to regenerate the proper sound field with the five speakers:

(i) set the size (e.g., large/small or existence/absence) of each speaker;

(ii) set the existence/absence of the subwoofer;

(iii) set the value of the distance from each speaker to the listening position; and (iv) adjust the balance of the sound volume for each speaker.

As for the above items (i) to (iv), the listener may input respective setting values or existence/absence indications serially in accordance with the setting menus on the amplifier or the receiver. In particular, as for the items (i), (iii) and (iv), the settings are required for each of the five speakers.

(2) Setup of the Listening Position (Adjustment of the Sound Volume Balance when the Listening Position is Changed)

Since it is desirable for the listener to listen to the music or watch the movie in the center between the left and right speakers, the sound volume balance is usually pre-adjusted to the state in which the listener takes a position in the center. However, if the listener changes his or her position to any position other than the center, a further adjustment of the sound volume balance may be required because the sound volume balance has become inappropriate due to the listening position change.

(3) Adjustment of the Room Acoustic Condition

Under the usual environment surrounding the listener, such phenomena can often occur that a particular frequency of the sound from the speakers tends to be reflected, diffracted and absorbed with the influence of the windows and/or furnishings. Accordingly, although a flat frequency characteristic is output from the amplifier or speakers, the frequency characteristic at the listener position may represent somewhat ups and downs. Therefore, such adjustment may be required as to gain a flat frequency characteristic at the listener position by means of adjustment of the graphic equalizer.

As for the configuration of speakers in the above item (1), the procedures and the setting items are usually too many, troublesome and not easy for listeners. Accordingly, if the listener, for example, watches the movie without an appropriate setup, there may exist such problem that the listener cannot gain the proper sound field.

Besides, as for adjustment of the sound volume balance in the above item (2), listeners have been conventionally requested to operate the remote control unit at the listening position to adjust the sound volume balance while he or she is actually hearing the sound with his or her ears. Accordingly, whenever the listener changes his or her listening position, he or she has to make a further adjustment, which may be troublesome to the listener.

Moreover, as for the adjustment of the room acoustic condition in the above item (3), conventionally, it has been difficult for the listener to adjust the frequency characteristic exactly so as make it flat because the listener should have made such adjustment based on his or her perception with his or her ears. Also, because the variation of frequency characteristic is caused by the sound reflection, diffraction and absorption against the window and/or interior furnishings, the listener has to make a room acoustic adjustment whenever the listener changes his or her listening position.

SUMMARY OF THE INVENTION

It is an object of the invention to address the above-stated problems. Thus, it is an objective of the invention to realize a remote control apparatus and a receiver that are capable of automatically performing various setups, adjustments and corrections for the receiver in an audio system having a plurality of speakers.

The invention achieves the above-stated objective as follows:

(1) The invention provides a remote control apparatus capable of operating and adjusting a multi-channel receiver. The remote control apparatus is characterized in that the remote control apparatus comprises transmitting means for transmitting data to the receiver, a microphone for receiving the sound outputted from the receiver, and arithmetic operating means for calculating the state of the receiver from the sound received by the microphone and analyzing an adjustment value for the receiver based on a calculation result, and that the transmitting means transmits data for initiating adjustment for the receiver and transmits an analysis result obtained by the arithmetic operating means. This remote control apparatus first transmits the data for initiating the adjustment for the receiver, then uses the microphone to receive the sound from the receiver, and transmits back to the receiver the analysis result obtained through the calculation upon the received sound by the arithmetic operating means. With such structure, it becomes possible to automatically perform various setups, adjustments and corrections for the receiver in the audio system having and using a plurality of speakers.

(2) The inventive remote control apparatus as disclosed in the above (1) is further characterized in that the state of the receiver is at least one of a distance from a speaker to the remote control apparatus, a frequency characteristic or a sound pressure level. Thus, this inventive remote control apparatus is configured to send to the receiver at least one of a distance from a speaker to the remote control apparatus (namely, the listening position), a frequency characteristic and a sound pressure level as the analysis result obtained by the arithmetic operating means, so that it becomes possible, in the audio system using a plurality of speakers, to automatically perform various setups, adjustments and corrections in terms of at least one of the distance from a speaker to the listening position, the frequency characteristic and the sound pressure level.

(3) The inventive remote control apparatus as disclosed in the above (1) or (2) is further characterized in that the remote control apparatus comprises two microphones. Provision of the two microphones can generate the equivalent effect as dummy heads, so that it becomes possible to make a measurement under the approximately same condition as the real environment.

(4) The inventive remote control apparatus as disclosed in the above (1) or (2) is further characterized in that the remote control apparatus additionally comprises an apparatus main body, first and second microphones arranged at a front portion of said apparatus main body, first and second rotation holding plates which, respectively, hold said first and second microphones and to which partial gear portions that can be engaged with each other are formed and a swiveling knob which engages with at least one of said first and second rotation holding plates to give a swiveling force thereto. In particular, the first and second rotation holding plates are pivoted to the apparatus main body such that the plates engage with each other to swivel in opposed directions. Thus, with the use of the two microphones that are strongly directional and are supported so as to be substantially pivoted to the apparatus main body, it becomes possible to receive the sound directly from the speakers without any influence of the reflection from the wall and other environmental objects.

(5) The inventive remote control apparatus as disclosed in the above (1), (2) or (3) is further characterized in that the remote control apparatus additionally comprises receiving means for receiving data from the receiver, and that the data received by the receiving means from the receiver is referenced while the state of the receiver is calculated by the arithmetic operating means. With this receiving means, it becomes possible to make an adjustment for the receiver while keeping a bi-directional communication with the receiver, which may be in turn resulted in more fine and correct adjustments.

(6) The invention further provides a receiver that is operated and adjusted by a remote control apparatus and capable of multi-channel sound outputting. This inventive receiver is characterized in that the receiver comprises receiving means for receiving data from said remote control apparatus and controlling means for controlling sound outputs from respective channels, that the controlling means outputs a predetermined test tone from each channel by receiving at the receiving means data for initiating adjustment from the remote control apparatus, and that the controlling means controls the state of each channel in accordance with an adjustment value by receiving at the receiving means the adjustment value from the remote control apparatus. This inventive receiver outputs the test tone from each channel upon receiving the data for initiating the adjustment from the remote control apparatus, so that the remote control apparatus can receive and analyze the test tone. The receiver finally receives the analysis result from the remote control apparatus. With this structure, it becomes possible to automatically perform various setups, adjustments and corrections for the receiver in the audio system having and using a plurality of speakers.

(7) The inventive receiver as disclosed in the above (6) is further characterized in that the state of the receiver is at least one of a distance from a speaker to the remote control apparatus, a frequency characteristic, or a sound pressure level. Thus, the inventive receiver is configured to receive at least one of the distance from the speaker to the remote control apparatus (namely, the listening position), the frequency characteristic or the sound pressure level as the analysis result obtained by the remote control apparatus, so that it becomes possible, in the audio system using a plurality of speakers, to automatically perform various setups, adjustments and corrections in terms of at least one of the distance from the speaker to the listening position, the frequency characteristic and the sound pressure level.

(8) The inventive receiver as disclosed in the above (6) or (7) is further characterized in that the receiver additionally comprises transmitting means for transmitting data to the remote control apparatus, and that the data required for calculation in the remote control apparatus is transmitted. With this transmitting means on the receiver, it becomes possible to make an adjustment for the receiver while keeping the bi-directional communication with the remote control apparatus, which may be in turn resulted in more fine and correct adjustments for the receiver.

(9) The invention furthermore provides an audio system comprising a remote control apparatus capable of operating and adjusting a multi-channel receiver and a receiver which is operated and adjusted by said remote control apparatus and capable of multi-channel sound outputting. This audio system is characterized in that the remote control apparatus comprises transmitting means for transmitting data to said receiver, a microphone for receiving sound outputted from said receiver and arithmetic operating means which calculates the state of said receiver from the sound received by said microphone and analyzes an adjustment value for said receiver from a calculation result, that the receiver comprises receiving means for receiving data from said remote control apparatus and controlling means for controlling sound outputs for respective channels, that the controlling means of the receiver outputs a predetermined test tone from each channel by transmitting data for initiating adjustment for the receiver from the transmitting means and receiving data for initiating adjustment by the receiving means, and transmits an analysis result obtained by the arithmetic operating means from the transmitting means to the receiver, and that the controlling means controls the state of each channel in accordance with an adjustment value received by said receiving means.

The receiver within this inventive audio system outputs the test tone from each channel upon receiving the data for initiating the adjustment from the remote control apparatus so that the remote control apparatus can receive and analyze the test tone. The receiver finally receives the analysis result from the remote control apparatus. With this structure, it becomes possible to automatically perform various setups, adjustments and corrections for the receiver in the audio system using a plurality of speakers.

(10) The inventive audio system as disclosed in the above (9) is further characterized in that the state of the receiver is at least one of a distance from a speaker to the remote control apparatus, a frequency characteristic, or a sound pressure level. Thus, it becomes possible, in the audio system using a plurality of speakers, to automatically perform various setups, adjustments and corrections in terms of at least one of the distance from each speaker to the listening position, the frequency characteristic and the sound pressure level.

(11) The inventive receiver as disclosed in the above (9) or (10) is further characterized in that the receiver additionally comprises transmitting means for transmitting data to the remote control apparatus, and that the data required for calculation in the remote control apparatus is transmitted. With this transmitting means on the receiver, it becomes possible to make an adjustment for the receiver while keeping the bi-directional communication with the remote control apparatus, which may be in turn resulted in more fine and correct adjustments for the receiver.

DESCRIPTION OF THE PREFERRED EMBODIMENTS

A. First Embodiment

Figure 1:
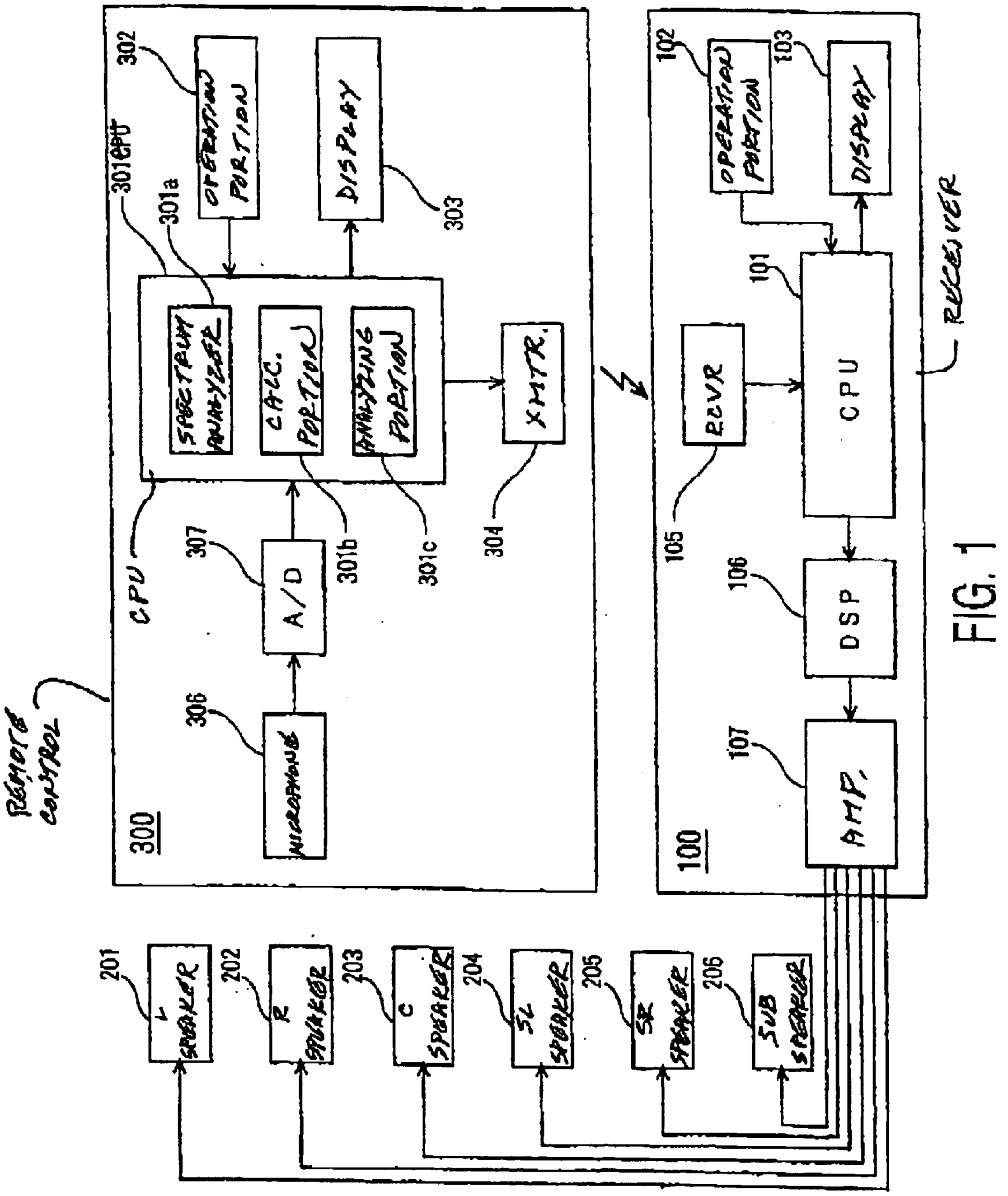
FIG. 1 is a schematic diagram illustrating the electric structure of the audio system in accordance with the first embodiment of the invention.

FIG. 1 schematically illustrates an audio system that comprises a receiver 100 and a remote control apparatus 300. As shown in FIG. 1, five speakers 201, 202, 203, 204 and 205 and a subwoofer 206 are connected to the receiver 100. The receiver in FIG. 1 can be operated and adjusted by the remote control apparatus as described later in detail and can output multi-channel sounds. The receiver 100 is configured to have a CPU 101 as a controller for controlling the sound output of each channel and each of the system components, an operation portion 102 for receiving various operation inputs, a display portion 103 for displaying various kinds of status, a receiving portion 105 for receiving the data in electromagnetic waves or infrared radiations from the remote control apparatus, a digital signal processor (DSP) 106 for performing various acoustic processes based on the instruction from the CPU 101 and an amplifier 107 for amplifying audio signals of multi-channels under the control of the CPU 101 and the DSP 106.

In addition, the remote control apparatus 300 performs remote operations and adjustments for the receiver 100. This remote control apparatus 300 is configured to have a CPU 301 as a controller for controlling each of the system components, an operation portion 302 for receiving various operation inputs, a display portion 303 for displaying various kinds of status, a transmitting portion 304 for transmitting the data in electromagnetic waves or infrared radiations to the receiver 100, a microphone 306 as a sound-to-electric converter for generating sound signals in response to its detection of the sounds from the speakers, and an A/D converter 307 for converting the electric signals generated by the microphone 306 to the digital data.

The CPU 301 is also configured to have a spectrum analyzer 301*a* for analyzing frequency elements of the sounds received by the microphone 306, a calculation portion 301*b* for calculating the output state of the receiver 100 from the sounds received by the microphone 306 and an analyzing portion 301*c* for analyzing adjustment values for the receiver 100 from the result of the calculation by the calculating portion 301*b*. The calculation portion 301*b* and the analyzing portion 301*c* together comprise arithmetic operation means. Moreover, the frequency characteristic of the microphone 306 is preferably flat and non-directional.

It should be noted that although the spectrum analyzer 301*a*, the calculation portion 301*b* and the analyzing portion 301*c* are integrated within the CPU 301 in the first embodiment shown in FIG. 1, they can be disposed as separate circuits. Furthermore, the spectrum analyzer 301*a* may alternatively be an analog processing circuit.

Figure 2:
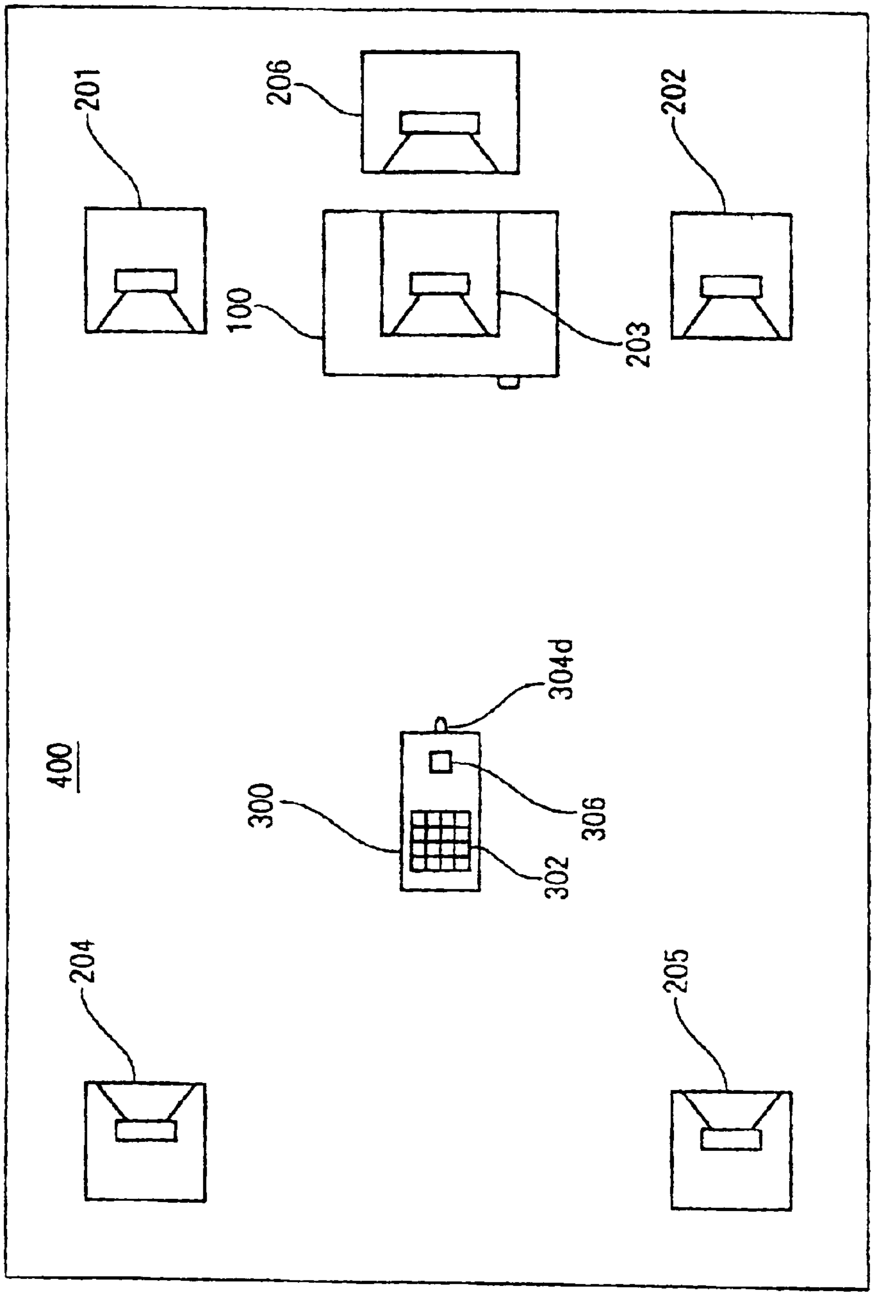
FIG. 2 is a schematic diagram illustrating the structure of the placement of each of the components of the audio system in accordance with the embodiment of the invention.

FIG. 2 illustrates an arrangement of the components of the audio system in a listening room, where speakers 201–206 are placed so as to form 5.1 channels. A speaker 201 is a front left one (L). 202 is a front right one (R), 203 is a front center one (C), 204 is a rear left one (SL), 205 is a rear right one (SR) and 206 is a subwoofer (Sub), respectively. The receiver 100 is placed near the center speaker 203, and the remote control apparatus is placed at the listening position for the listener to easily operate it.

Figure 3:
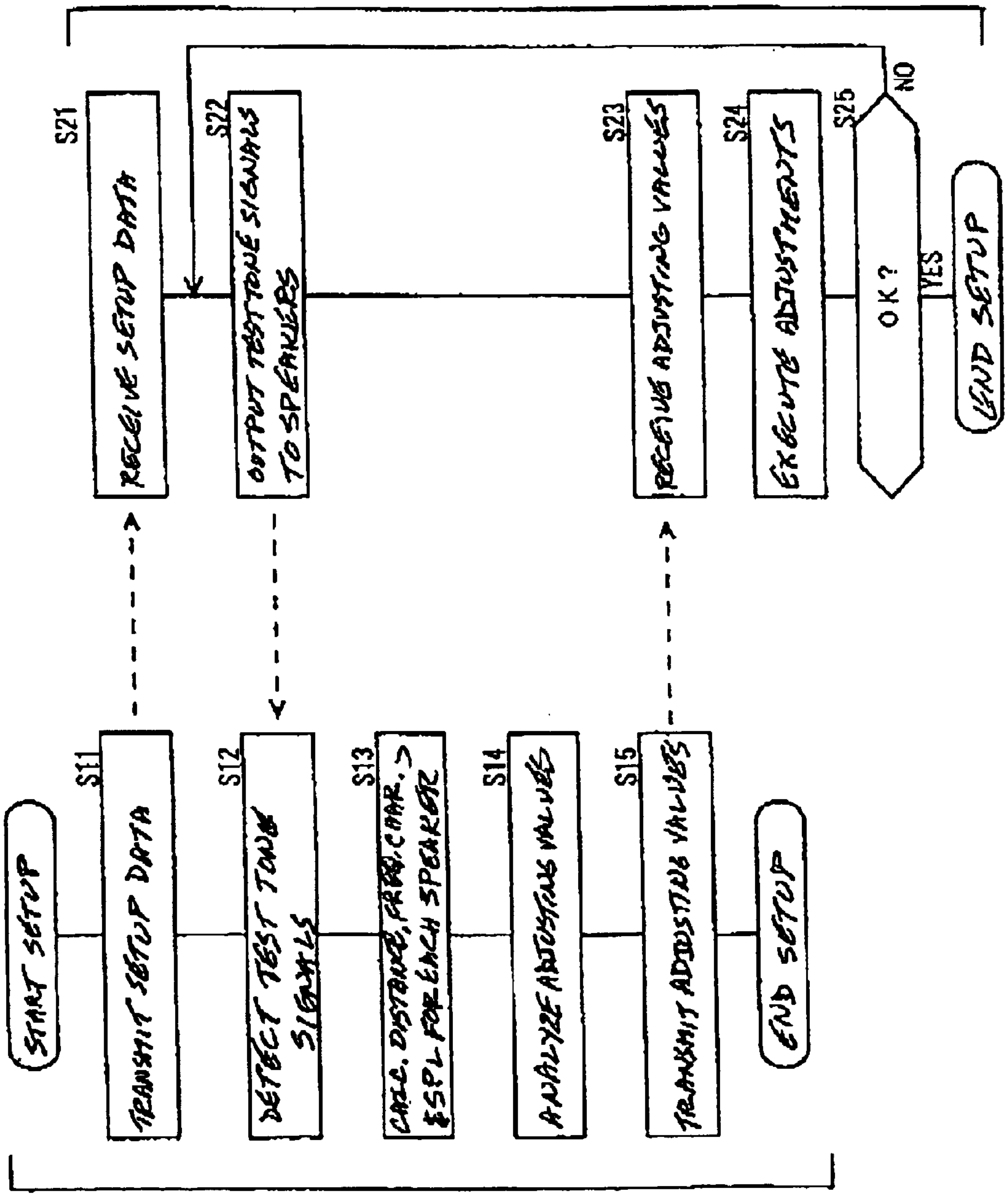
FIG. 3 is an operational flowchart for the first embodiment of the invention.

Now referring to FIG. 3, the operation of the audio system, comprising the receiver 100 and the remote control apparatus 300, will be explained below. Assume that the receiver 100 in the listening room 400 has been already powered on, that the connection between the receiver 100 and the speakers 201–205 has been already established, and that the remote control apparatus 300 is being kept by the listener at the listening position. In this situation, the remote control apparatus may be changed over from a normal mode to a setup mode (in START SETUP step in FIG. 3) by the listener's operation of depressing the "setup" button (not shown herein) mounted at the operation portion 302 of the remote control apparatus 300.

The remote control apparatus 300, after having been changed over to the setup mode, transfers the setup data, in accordance with the instruction of the CPU 301, from its transmitting portion 304 to the receiver 100 for initiating an adjustment of the receiver 100 (step S11). Then, the receiver 100 receives that setup data from the remote control apparatus 300 at its receiving portion 105, and performs the required system setup with the assistance of the CPU 101 (step S21). The CPU 101 of the receiver 100 outputs a series of the predetermined test tone signals from each of the channels (step S22). In particular, the CPU 101 controls each of the speakers, for example, in a sequence of L, C, R, SR, SL and Sub, to output a pink noise pulse having a certain frequency and a certain sound pressure level (SPL) with a predetermined timing interval through the amplifier 107.

Then, test tone signals are received by the microphone 306 of the remote control apparatus 300 and delivered to the CPU 301 after having been converted to the digital data by the A/D converter 307 (step S12). Thereafter, the CPU 301 of the remote control apparatus 300 calculates a state of the receiver output, a state of the listening room and states of each of the speakers based on the digital data received from the microphone 306. In other words, the spectrum analyzer 301*a* and the calculating portion 301*b* of the CPU 301 cooperate to calculate a distance from each speaker to the remote control apparatus (namely, the listening position), a frequency characteristic and a sound pressure level (step S13).

Then, the analyzing portion 301*c* analyzes, at step S14, adjusting values from the calculation results of the calculating portion 301*b*. In particular, such analysis may include:

whether or not the sound pressure level (SPL) of each speaker is within an equivalent level at the listening position, or which channel(s) and to what degree should be adjusted so as to make all sound pressure levels equal;

determining the size (large or small) of each speaker based on the distribution of frequency characteristics; and analyzing what time difference each sound from each speaker has reached the listening position with, so as to calculate the distances from respective speakers to the listening position.

Then, the CPU 301 of the remote control apparatus 300 transmits such analysis results from the transmitting portion 304 to the receiver 100 (step S15), so that the receiver 100 may receive the analysis result from the remote control apparatus 300 at its receiving portion 105 (step S23). Accordingly, the CPU 101 of the receiver 100 can perform various adjustments required to set up the speakers (speaker configuration) based on the analysis result (step S24). It is particularly desirable for the CPU 101 to return to the step S22 for outputting the test tone again to assure that the receiver has been adjusted so as to be in the desired state. If required, a further adjustment may be performed (steps S24 to S22). Finally, the remote control 300 and the receiver 100 may complete the setup mode and change over back to the normal mode (setup end).

The operation just explained above was in conjunction with the setup of the speaker configuration. In case of the listening position setup in response to the change of the listening position, the remote control apparatus 300 may be changed over from a normal mode to a listening position setup mode by the listener's operation of depressing the "level set" button (not shown herein) connected to the operation portion 302 of the remote control apparatus 300. In this situation, some required adjustments for the sound pressures for each speaker may be automatically performed according to the same procedure as explained above.

Also, as for the room acoustic adjustment to adjust the inappropriate frequency characteristics due to reflection, diffraction, absorption and so on in the listening room, the remote control apparatus 300 may be changed over from a normal mode to a room acoustic adjustment setup mode by the listener's operation of depressing the "acoustic" button (not shown herein) connected to the operation portion 302 of the remote control apparatus 300. In this situation again, it is possible to automatically perform some required adjustments for obtaining the flat frequency characteristic of each speaker according to the same procedure as explained above.

In accordance with the embodiment as explained above, it is possible to automatically perform some setup, adjustments and corrections for the receiver in the audio system using a plurality of speakers without any complicated and troublesome operation by the listener.

B. Second Embodiment

Figure 4:
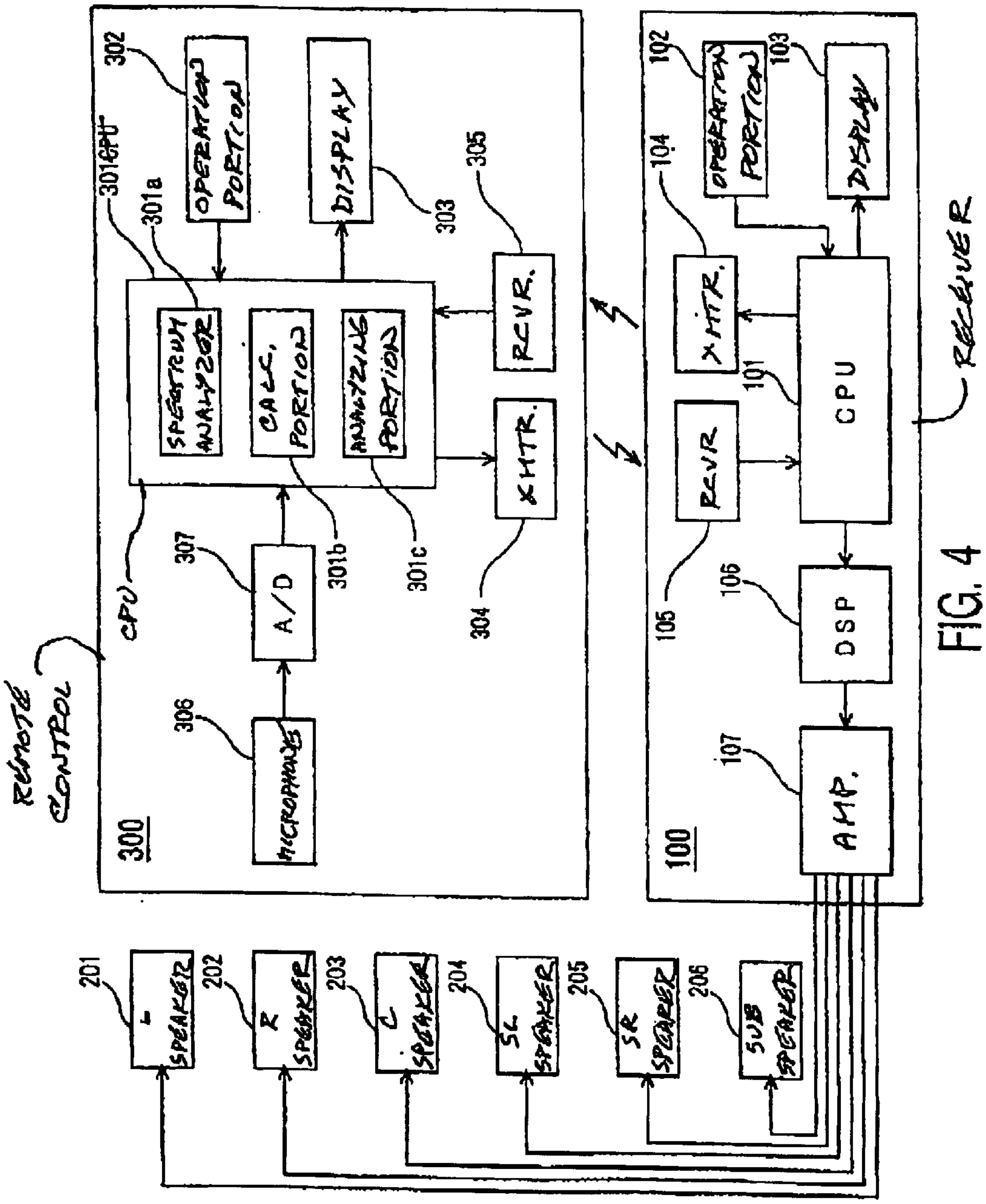
FIG. 4 is a schematic diagram illustrating the electric structure of the audio system in accordance with the second embodiment of the invention.

FIG. 4 illustrates an audio system comprising a receiver 100 and a remote control apparatus 300 in accordance with the second embodiment of the invention, where the same reference numbers are given to the equivalence as those in FIG. 1. Such equivalence will not be described in the following to avoid duplication.

Within the second embodiment, the receiver 100 may additionally comprise a transmitting portion 104 for transmitting data to the remote control apparatus 300, and the remote control apparatus 300 may also additionally comprise a receiving portion 305 for receiving the data from the receiver 100.

With this structure, the receiver 100 and the remote control apparatus 300 together could transmit and receive the data to/from each other to perform adjustments. Thus, it becomes possible to make more fine and exact adjustments through such bi-directional communications between the receiver 100 and the remote control apparatus 300.

In particular, in the second embodiment, it is possible for the receiver 100 to send the data required for the calculation to be performed at the side of the remote control apparatus 300 through the communication with the remote control apparatus 300. Besides, because of the bi-directional communication, it becomes possible to display such information as adjustment progress status, components to be adjusted and adjustment completion event not only on the display portion 103 of the receiver or the TV screen (on-screen display) that is to be connected to the receiver 100, but also on the display portion 303 of the remote control apparatus 300 near the listener.

In addition, in the second embodiment, the remote control apparatus may store, as a learnable remote control, signals of some remote control units supplied from other manufacturers with the receiving portion 305 of the remote control apparatus 300. Moreover, it may be possible for the user to easily locate the remote control apparatus 300 by recognizing some blinking or beeping event issued from the remote control apparatus 300 in response to reception (at its receiving portion 305) of the data transmitted from the transmitting portion 104 of the receiver only if the user pushes a certain button on the operation portion 102 of the receiver 100.

C. Third Embodiment

Figure 5:
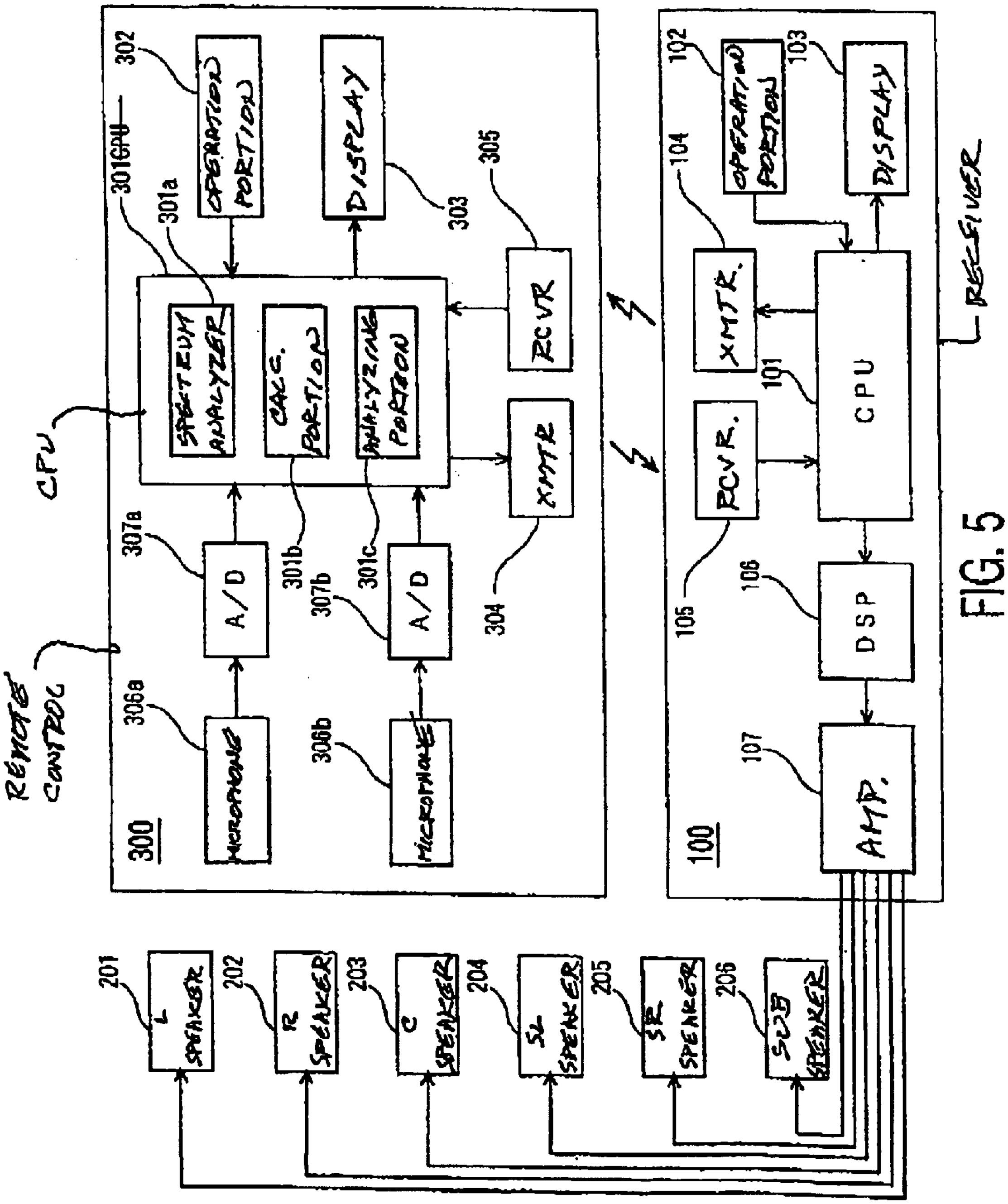
FIG. 5 is a schematic diagram illustrating the electric structure of the audio system in accordance with the third embodiment of the invention.

FIG. 5 illustrates an audio system comprising a receiver 100 and a remote control apparatus 300 in accordance with the third embodiment of the invention, where the same code numbers are given to the equivalence as those in FIG. 1 and/or FIG. 4. Such equivalence will not be described in the following to avoid duplication.

Within the third embodiment, the remote control apparatus 300 comprises two microphones 306*a* and 306*b* instead of one microphone 306 in the first and second embodiments. The remote control apparatus 300 also comprises two A/D converters 307*a* and 307*b* that are configured to respectively convert signals from each of the two microphones 306*a* and 306*b* to supply converted signals to the CPU 301.

Figure 6:
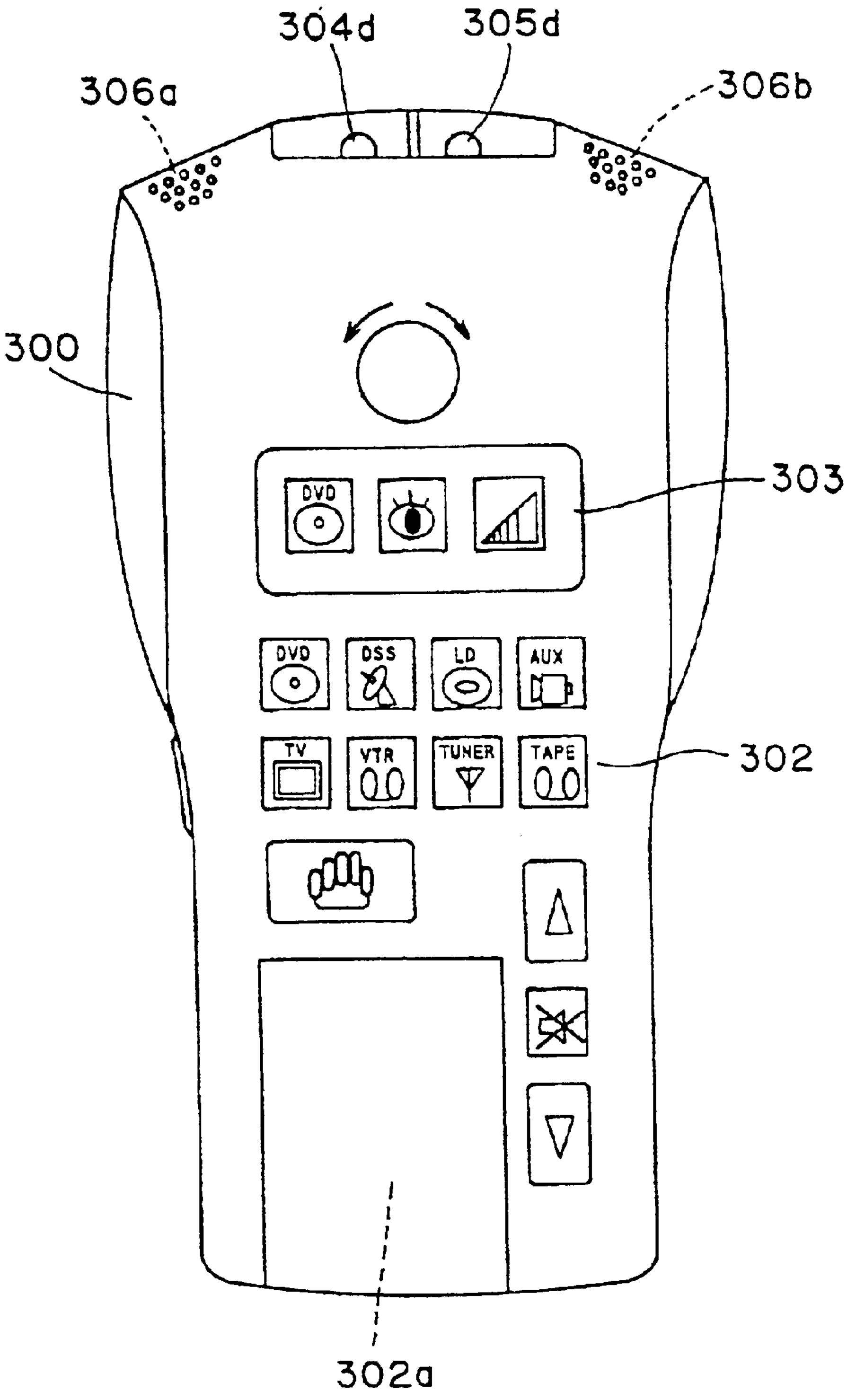
FIG. 6 is a schematic illustration of the remote control apparatus used in the third embodiment of the invention.

FIG. 6 illustrates the appearance of the remote control apparatus 300 in accordance with the third embodiment. In particular, on the upper surface of the body portion of the remote control apparatus 300, there are provided the operation portion 302, a group of setup buttons 302*a* (not show herein) usually covered with a cover and a LCD display portion 303. Besides, on the front side of the body portion of the remote control apparatus 300, there are provided an infrared LED 304*d* for transmitting the data and a photodiode 305*d* for receiving the data. The remote control apparatus 300 additionally comprises two microphones 306*a* and 306*b* that have a relatively wide directivity and are mounted separately each other at the left and right sides, respectively, on the front side of the main body.

With such separate arrangement of the two microphones on both left and right sides of the main body of the remote control apparatus 300, it may be possible to gain the equivalent effect as in case of dummy heads, so as to collect and measure the test tone under the approximately same condition as the real environment of the listener. It is also possible to collect the test tone in all ranges including the rear side by using the two microphones having the relatively wide directivity.

Alternatively, the two microphones 306*a* and 306*b* may be mounted on the respective side faces of the main body of the remote control apparatus 300 rather than on the left and right portions of the front side as illustrated in FIG. 6. It should be noted that while the configuration of this third embodiment in FIG. 5 contains the bi-directional communication facility in the same manner as in the second embodiment, it may alternatively include only a unidirectional facility as in the first embodiment.

D. Fourth Embodiment

Figure 7:
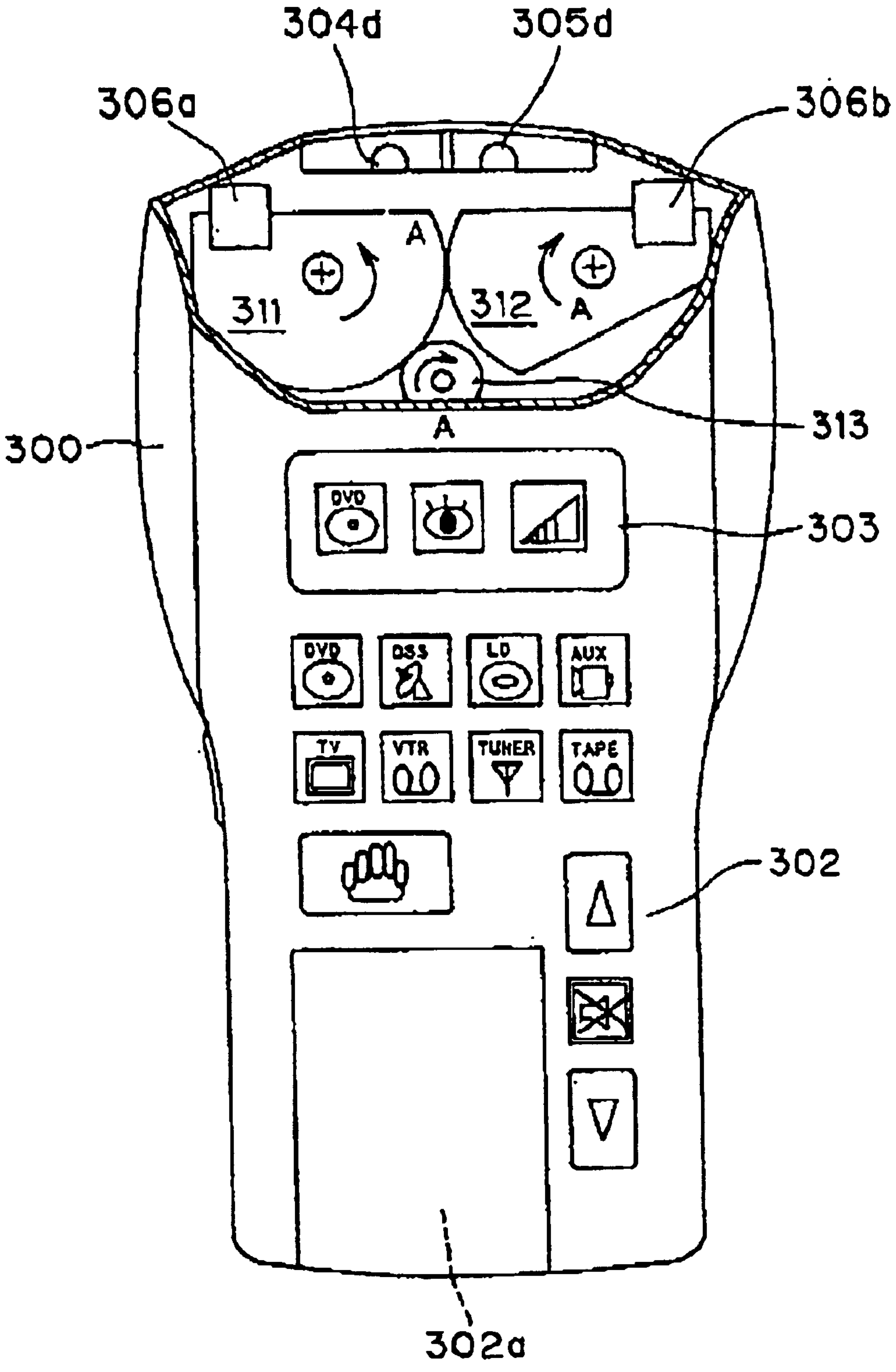
FIG. 7 is a schematic illustration of the remote control apparatus, partially containing a notch, used in the fourth embodiment of the invention.

FIG. 7 illustrates a remote control apparatus 300, which is configured to partially include a notch, in accordance with the fourth embodiment of the invention, where the same numbers are given to the equivalence as those in FIG. 6. Such equivalence will not be described in the following to avoid duplication.

On the upper surface of the main body of the remote control apparatus 300, there are provided two microphones 306*a* and 306*b* for collecting the monitor sounds as test tones as illustrated in FIG. 7. These two microphones 306*a* and 306*b* are held by rotation holding plates 311 and 312, respectively. The rotation holding plates 311 and 312 comprise respective partial gear portions (not shown herein) that have the same diameter and can be engaged with each other. The rotation holding plates 311 and 312 are supported with a cage member (not show herein) of the main body in such manner that those partial gear portions are engaged with each other. In addition, on the remote control apparatus 300, there are provided a small gear 313 that is pivoted to the main body so as to be engaged with the partial gear portion of the rotation holding plate 311 and also an operation knob (not shown herein) to be integrated with the small gear 313.

With such configuration of the remote control apparatus 300, when the operation knob is handled to rotate the small gear 313, which is configured to be coaxial with the operation knob, in the direction of arrow A as shown in FIG. 7, the rotation holding plate 311 will be correspondingly rotated toward the opposite direction against the arrow A while the rotation holding plate 312 will be correspondingly rotated toward the same direction as the arrow A. At this time, the rotation holding plates 311 and 312 together are rotated with the equal angle amount toward the open direction because the diameters of both plates are in the equal size.

Thus, when the operator aims the remote control apparatus 300 toward a speaker as a sound source and handles the operation knob, the rotation holding plates 311 and 312 will be rotated so that both of the microphones, held with the respective rotation holding plates, can move by the equal rotation amount toward either open or close direction and receive the test tone from the opposite sound source in the approximately perpendicular direction. In other words, it is possible for the microphones, if they are strongly directional, to selectively receive the test tone sounds from a plurality of the sound sources in the almost same condition as in the case where the listener hears the sound with a pair of ears.

It should be noted that although the diameters of the partial gears of the rotation holding plates 311 and 312 are equal in the remote control apparatus 300 in accordance with the forth embodiment, each of the diameters may be preferably selected in accordance with the overall design specification, and the degree to open or close the axial lines of the microphones 306*a* and 306*b* by means of the operation knob may be also preferably selected in accordance with the system usage environment.

Furthermore, the remote control apparatus 300 may be configured such that the rotation of the small gear 313 could be driven by means of a motor, the test tone output from the opposite sound source could be of linearity and high frequency (e.g., 5 kHz and more), and the degree to open or close the axial lines of the microphones 306*a* and 306*b* could be automatically adjusted to take such position as to receive the maximum amount of the test tone. With such configuration, the output level of the opposite sound source could be adjusted based on the test tone. This configuration allows for the listening position to be exactly adjusted through the use of the microphones having strong directionality.

It should be further noted that although the microphones 306*a*, 306*b* as above described are configured to be rotated with the equal angle amount, they may have respective different rotation angles by providing separate rotation knobs and/or separate motor drives. With such different angles, it may be possible to selectively receive a plurality of the sound sources even if the listening position may be one-sided to either right or left direction from the center of the listening room 400.

Consequently, in accordance with the invention as above described, it is possible to realize the audio system comprising the remote control apparatus and the receiver which can automatically perform setups, adjustments and corrections for the receiver within the audio system using several speakers.

What is claimed is:

1. A remote control apparatus capable of operating and adjusting a multi-channel receiver, said remote control apparatus comprising:

- transmitting means for transmitting data to said receiver;
- at least one microphone for receiving sound outputted from said receiver;
- arithmetic operating means for calculating a state of said receiver from said sound received by said at least one microphone, and for analyzing an adjustment value for said receiver based on a calculation result; and
- receiving means, separate from said at least one microphone, for receiving data from said receiver, said data received by said receiving means from said receiver being required by said arithmetic operating means in calculating the state of said receiver, wherein said transmitting means transmits data for initiating adjustment for said receiver and transmits an analysis result obtained by said arithmetic operating means.

2. The remote control apparatus as claimed in claim 1, wherein the state of said receiver is at least one of a distance from a speaker of said receiver to said remote control apparatus, a frequency characteristic, or a sound pressure level.

3. The remote control apparatus as claimed in claim 1, wherein said at least one microphone comprises two microphones.

4. A remote control apparatus capable of operating and adjusting a multi-channel receiver, said remote control apparatus comprising:

- transmitting means for transmitting data to said receiver;
- at least one microphone for receiving sound outputted from said receiver; and
- arithmetic operating means for calculating a state of said receiver from said sound received by said at least one microphone, and for analyzing an adjustment value for said receiver based on a calculation result, wherein said transmitting means transmits data for initiating adjustment for said receiver and transmits an analysis result obtained by said arithmetic operating means, and wherein said remote control apparatus further comprises:

- an apparatus main body;
- first and second microphones arranged to a front portion of said apparatus main body;
- first and second rotation holding plates for respectively holding said first and second microphones, said first and second rotation holding plates having partial gear portions formed therein for engaging with each other; and
- a swiveling knob for engaging at least one of said first and second rotation holding plates, said swiveling knob imparting a swiveling force to said at least one of said first and second rotation holding plate, wherein said first and second rotation holding plates are pivotably mounted to said apparatus main body such that said plates engage with each other to swivel in opposed directions.

5. A receiver operable and adjustable by a remote control apparatus and capable of multi-channel sound outputting, said receiver comprising:

receiving means for receiving data from said remote control apparatus;

controlling means for controlling sound outputs from respective channels; and transmitting means, separate from said multi-channel sound outputting, for transmitting data to said remote control apparatus, said data being required for calculation in said remote control apparatus, wherein said controlling means outputs a predetermined test tone from each channel by receiving at said receiving means data for initiating adjustment from said remote control apparatus, and said controlling means controls a state of each channel in accordance with an adjustment value by receiving at said receiving means said adjustment value from said remote control apparatus.

6. The receiver as claimed in claimed 5, wherein the state of said receiver is at least one of a distance from a speaker of said receiver to said remote control apparatus, a frequency characteristic, or a sound pressure level.

7. An audio system comprising:

a remote control apparatus capable of operating and adjusting a multi-channel receiver; and a receiver operable and adjustable by said remote control apparatus, and capable of multi-channel sound outputting, said remote control apparatus comprising:

first transmitting means for transmitting data to said receiver;

a microphone for receiving sound outputted from said receiver;

first receiving means, separate from said microphone, for receiving data from said receiver; and arithmetic operating means for calculating a state of said receiver from the sound received by said microphone and data from said receiver received by said first receiving means, and for analyzing an adjustment value for said receiver from a calculation result, said receiver comprising:

second receiving means for receiving data from said remote control apparatus;

controlling means for controlling sound outputs for respective channels; and second transmitting means, separate from said sound outputs, for transmitting data to said remote control apparatus, wherein said controlling means of said receiver outputs a predetermined test tone from each channel by transmitting data for initiating adjustment for said receiver from said second transmitting means to said remote control apparatus, and receiving data for initiating adjustment by said second receiving means from said remote control apparatus, and transmits analysis result data from said second transmitting means to said remote control apparatus in response to said adjustment value generated by said arithmetic operating means and transmitted from said first transmitting means to said receiver, whereby said controlling means controls a state of each channel in accordance with the adjustment value received by said second receiving means, and wherein said remote control apparatus and said receiver alternately execute transmission and reception of data while performing adjustment.

8. The audio system as claimed in claim 7, wherein the state of said receiver is at least one of a distance from a speaker of said receiver to said remote control apparatus, a frequency characteristic, or a sound pressure level.

* * * * *